US006943381B2

(12) United States Patent
Gardner et al.

(10) Patent No.: US 6,943,381 B2
(45) Date of Patent: Sep. 13, 2005

(54) III-NITRIDE LIGHT-EMITTING DEVICES WITH IMPROVED HIGH-CURRENT EFFICIENCY

(75) Inventors: Nathan F. Gardner, Mountain View, CA (US); Christopher P. Kocot, Palo Alto, CA (US); Stephen A. Stockman, Morgan Hill, CA (US)

(73) Assignee: Lumileds Lighting U.S., LLC, San Jose, CA (US)

( * ) Notice: Subject to any disclaimer, the term of this patent is extended or adjusted under 35 U.S.C. 154(b) by 0 days.

(21) Appl. No.: 10/769,590

(22) Filed: Jan. 30, 2004

(65) Prior Publication Data

US 2005/0167690 A1 Aug. 4, 2005

(51) Int. Cl.⁷ ............................................. H01L 33/00
(52) U.S. Cl. ..................... 257/103; 257/79; 257/103; 257/190; 257/615; 257/627; 257/94; 257/21; 257/14
(58) Field of Search .................... 257/79, 103, 190, 257/615, 627, 94, 21, 14

(56) References Cited

U.S. PATENT DOCUMENTS

| | | |
|---|---|---|
| 6,515,313 B1 | 2/2003 | Ibbetson et al. |
| 6,576,932 B2 * | 6/2003 | Khare et al. ................. 257/103 |
| 2002/0058349 A1 | 5/2002 | Khan et al. |

OTHER PUBLICATIONS

Shen et al., Indium Gallium Nitride Separate Confinement Heterostructure Light Emitting Devices, May 8, 2003.*
Jianping Zhang et al., "Enhanced luminescence in InGaN multiple quantum wells with quaternary AlInGaN barriers", Applied Physics Letters, vol. 77, No. 17, Oct. 23, 2000, pp. 2668-2670.
M.E. Aumer et al., "Strain-induced piezoelectric field effects on light emission energy and intensity from AlInGaN/InGaN quantum wells", Applied Physics Letters, vol. 79, No. 23, Dec. 3, 2001, pp. 3803-3805.
J. Zhang et al., "Pulsed atomic layer epitaxy of quaternary AlInGaN layers", Applied Physics Letters, vol. 70, No. 7, Aug. 13, 2001, pp. 925-927.
Changqing Chen et al., Pulsed Metalorganic Chemical Vapor Deposition of Quaternary AlInGaN Layers and Multiple Quantum Wells for Ultraviolet Light Emission, Jpn. J. Appl. Phys., vol. 41, (2002), Part 1, No. 4A, Apr. 2002, pp. 1924-1928.

* cited by examiner

Primary Examiner—David Nelms
Assistant Examiner—Mai-Huong Tran
(74) Attorney, Agent, or Firm—Patent Law Group LLP; Rachel V. Leiterman

(57) ABSTRACT

A light-emitting semiconductor device comprises a III-Nitride active region and a III-Nitride layer formed proximate to the active region and having a thickness that exceeds a critical thickness for relaxation of strain in the III-Nitride layer. The III-Nitride layer may be a carrier confinement layer, for example. In another aspect of the invention, a light-emitting semiconductor device comprises a III-Nitride light emitting layer, an $In_xAl_yGa_{1-x-y}N$ ($0 \leq x \leq 1$, $0 \leq y \leq 1$, $x+y \leq 1$), and a spacer layer interposing the light emitting layer and the $In_xAl_yGa_{1-x-y}N$ layer. The spacer layer may advantageously space the $In_xAl_yGa_{1-x-y}N$ layer and any contaminants therein apart from the light emitting layer. The composition of the III-Nitride layer may be advantageously selected to determine a strength of an electric field in the III-Nitride layer and thereby increase the efficiency with which the device emits light.

22 Claims, 10 Drawing Sheets

III-NITRIDE LIGHT-EMITTING DEVICES WITH IMPROVED HIGH-CURRENT EFFICIENCY

BACKGROUND

1. Field of Invention

The present invention relates to semiconductor light-emitting devices and, more particularly, to improving the quantum efficiency of III-Nitride light-emitting devices.

2. Description of Related Art

III-Nitride light-emitting devices are based on semiconducting alloys of nitrogen with elements from group III of the periodic table. Examples of such III-Nitride devices include $In_xAl_yGa_{1-x-y}N$ ($0 \leq x \leq 1$, $0 \leq y \leq 1$, $x+y \leq 1$) based light emitting diodes (LEDs) and laser diodes (LDs). Such III-Nitride light emitting devices are commercially valuable high brightness sources of, for example, ultraviolet, blue, and green light.

$In_xAl_yGa_{1-x-y}N$ crystals such as those from which $In_xAl_yGa_{1-x-y}N$ light emitting devices are formed typically adopt the wurtzite crystal structure and are consequently polarized even when not externally biased. The two types of polarization that are significant for III-Nitride light-emitting devices are the spontaneous and the piezoelectric polarizations. The spontaneous polarization arises from differences in the electronegativity of the constituent atoms of the III-Nitride semiconductor layers. The piezoelectric polarization arises from strain applied to the III-Nitride semiconductor layers by, for example, neighboring layers of different composition (and thus having different lattice constants). The total polarization in a III-Nitride semiconductor layer is the sum of the spontaneous polarization and the piezoelectric polarization of that layer. In a case where adjacent layers of III-Nitride semiconductors have different total polarizations, there will be a net polarization at the interface between the layers. The effect of the net polarization is to create sheets of fixed charge in the device at interfaces between III-Nitride layers of different alloy composition, and the magnitude and sign of the fixed sheet of charge is equal and opposite to the net polarization. The effect of the sheets of fixed charge is to create corresponding electric fields within the layers. These electric fields will be referred to herein as "polarization fields." The signs and magnitudes of the sheet charges and of the electric fields are determined by the crystal orientation, the strain in the layers, and the alloy compositions of the layers.

FIGS. 1A and 1B show conventionally simulated band structure diagrams for a portion of an $In_xAl_yGa_{1-x-y}N$ light-emitting device including an n-type GaN layer 2 formed over a substrate (not shown), an active region 4 (including barrier layers 6 and quantum well layers 8), a p-type $Al_{0.2}Ga_{0.8}N$ electron confinement layer 10, and a p-type GaN contact layer 12. The various layers illustrated are of wurtzite crystal structure with the c-axis of the crystal substantially perpendicular to the layers and directed from layer 2 toward layer 12. The simulations assume that the light-emitting device is driven at a forward current density of about 200 Amps/centimeter² (A/cm²). The horizontal axes in FIGS. 1A and 1B represent position in the device in a direction perpendicular to the layers. The interfaces between the layers are indicated by dashed lines. The vertical axes in FIGS. 1A and 1B represent the energy of the conduction band edge $E_c$ and of the valence band edge $E_v$ in the various layers.

In FIG. 1A, the simulated band structure accounts for polarization fields in n-layer 2 and active region 4, but neglects the polarization field in p-type $Al_yGa_{1-y}N$ electron confinement layer 10. Hence, this simulation is not physically realistic. By comparison to FIG. 1B, however, it will serve to illustrate the importance of the polarization field actually present in confinement layer 10 in prior art devices. The tilting of band edges $E_c$ and $E_v$ in the quantum wells and barrier layers of active region 4 as shown in FIG. 1A has been previously recognized to degrade the performance of such III-Nitride light-emitting devices. See, for example, U.S. patent application Ser. No. 09/912,589, titled "Light Emitting Diodes with Graded Composition Active Regions," assigned to the assignee of the present invention, and incorporated herein by reference. See also International Patent Application WO 01/41224 A2.

In FIG. 1B, the simulated band structure accounts for spontaneous and piezoelectric polarization fields in p-type $Al_yGa_{1-y}N$ electron confinement layer 10 as well as for polarization fields in layer 2 and in active region 4. In particular, this simulation includes a negative sheet charge located at the interface of electron confinement layer 10 and active region 4, and a positive sheet charge located at the interface between confinement layer 10 and contact layer 12.

A comparison of FIGS. 1A and 1B shows that the effect of the sheet charges around $Al_yGa_{1-y}N$ electron confinement layer 10 in FIG. 1B is to reduce the magnitude of the potential energy barrier 14 that inhibits electrons from diffusing out of active region 4 into electron confinement layer 10. This reduction in electron confinement due to the polarization field in electron confinement layer 10 causes the quantum efficiency (ratio of photons out to electrons in) of the prior art device illustrated in FIG. 1B to be lower than the quantum efficiency of the hypothetical device (having no polarization field in layer 10) illustrated in FIG. 1A, particularly at high drive current densities.

The difference in quantum efficiencies between the two devices is apparent in FIG. 1C, in which the quantum efficiency 16 of the prior art device of FIG. 1B and the quantum efficiency 18 of the hypothetical device of FIG. 1A are plotted as a function of forward drive current density. These quantum efficiencies were simulated by conventional techniques. As FIG. 1C indicates, at a forward current density of about 400 A/cm² the hypothetical device of FIG. 1A in which electron barrier layer 10 has no polarization field is three times as efficient as the prior art device of FIG. 1B in which electron barrier layer 10 is polarized.

Since the tilting of the band edges in the active region is substantially the same for the devices of FIGS. 1A and 1B, the drop in quantum efficiency of the prior art device shown in FIG. 1B at high drive current densities must be primarily due to the reduction in height of potential barrier 14 by the polarization field in electron confinement layer 10. The inventors believe that, in contrast to the effects of polarization fields in the active region, the decrease in electron confinement and hence in quantum efficiency due to the polarization field in the electron confinement layer has not been previously recognized. Moreover, polarization fields in n-type hole confinement layers may similarly reduce hole confinement and hence quantum efficiency. The inventors believe that the latter problem also has gone unrecognized.

What is needed is a III-Nitride light-emitting device having improved confinement of electrons and holes to its active region.

SUMMARY

In one aspect of the invention, a light-emitting semiconductor device comprises a III-Nitride active region and a III-Nitride layer formed proximate to the active region and having a thickness that exceeds a critical thickness for relaxation of strain in the III-Nitride layer. The III-Nitride layer may be a carrier confinement layer, for example. The piezoelectric polarization in the III-Nitride layer may be reduced as a consequence of its thickness. The reduced polarization may result in an advantageous increase in the efficiency with which the device emits light.

In another aspect of the invention, a light-emitting semiconductor device comprises a III-Nitride light emitting layer, an $In_xAl_yGa_{1-x-y}N$ ($0 \leq x \leq 1$, $0 \leq y \leq 1$, $x+y \leq 1$), and a spacer layer interposing the light emitting layer and the $In_xAl_yGa_{1-x-y}N$ layer. The spacer layer may advantageously space the $In_xAl_yGa_{1-x-y}N$ layer and any contaminants therein apart from the light emitting layer. The composition of the III-Nitride layer may be advantageously selected to determine a strength of an electric field in the III-Nitride layer and thereby increase the efficiency with which the device emits light.

BRIEF DESCRIPTION OF THE DRAWINGS

It should be noted that the dimensions in the figures are not necessarily to scale. Like reference numbers in the various figures denote like parts in the various embodiments.

DETAILED DESCRIPTION

Several embodiments are disclosed in which polarization fields are reduced in electron and/or hole confinement layers in III-Nitride light-emitting devices. Confinement of electrons and holes in the active regions of these devices may thereby be improved. This can result in devices with improved quantum efficiency. The III-Nitride light-emitting devices described may be, for example, light-emitting diodes or laser diodes.

Figure 2:
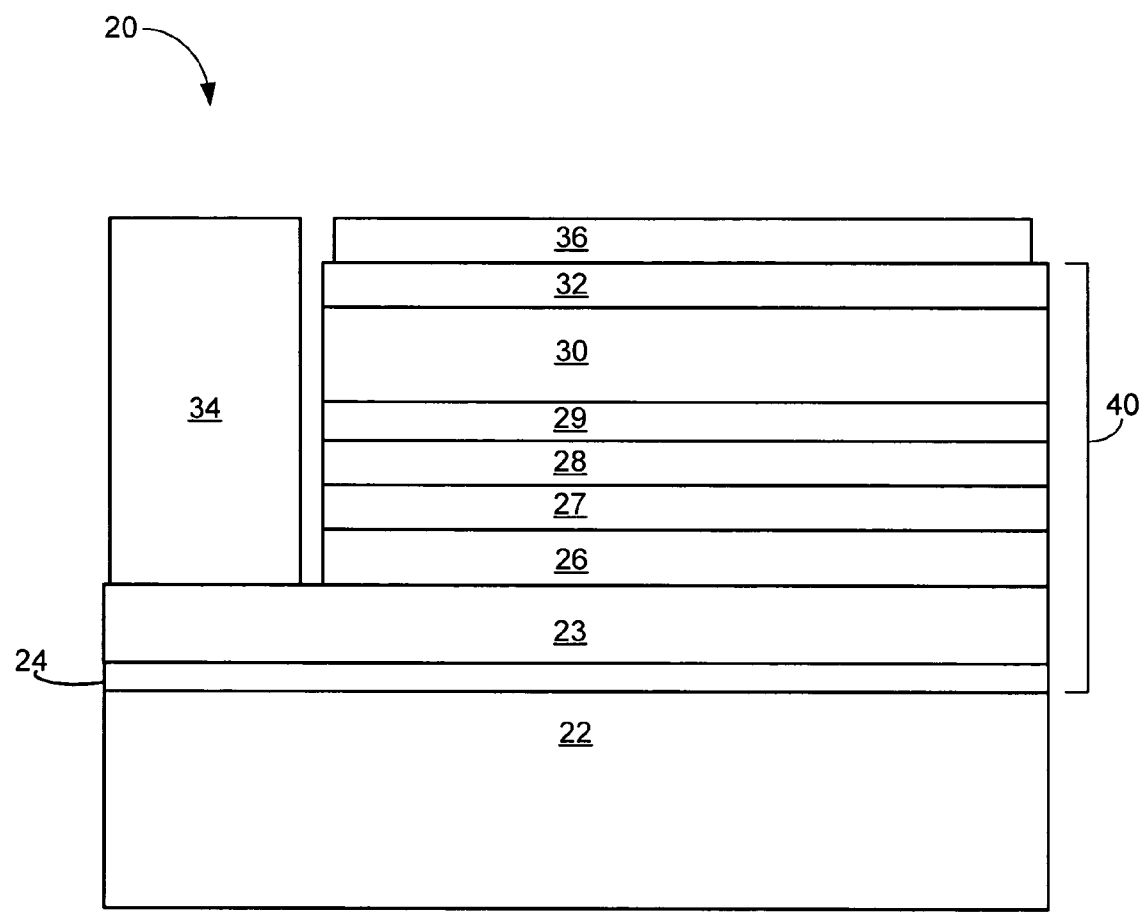
FIG. 2 is a schematic diagram of a III-Nitride light-emitting device according to one embodiment.

In one embodiment (FIG. 2), a III-N based LED 20 includes a sapphire substrate 22, a nucleation layer 24, an optional n-type III-Nitride contact layer, an n-type III-Nitride hole confinement layer 26, a III-Nitride active region 28, a p-type III-Nitride electron confinement layer 30, and an optional p-type III-Nitride contact layer 32. Active region 28 includes one or more quantum well layers and one or more barrier layers. Active region 28 may be spaced apart from electron confinement layer 30, hole confinement layer 26, or both by optional spacer layers 27 and 29. N-type ohmic electrode 34 may be disposed on n-type contact layer 23 or n-type hole confinement layer 26. P-type ohmic electrode 36 may be disposed on p-type contact layer 32 or p-type electron confinement layer 30. Application of a suitable forward bias across ohmic electrodes 34 and 36 results in emission of light from active region 28.

The various semiconductor layers in light-emitting device 20 may be deposited by, for example, conventional metalorganic chemical vapor deposition (MOCVD) techniques. Conventional photolithographic, etching, and deposition techniques may be used to form electrodes 34 and 36.

The inventors have recognized that the piezoelectric polarization in electron confinement layer 30 can be advantageously reduced by growing this layer to a thickness exceeding its critical thickness for relaxation. The critical thickness is the thickness beyond which sufficient dislocations form in electron confinement layer 30 to substantially relax the strain induced in it by the difference in lattice dimensions between it and the layers underneath it. A layer that is thicker than its critical thickness is typically referred to in the art as a "relaxed layer." The critical thickness for relaxation depends upon the particular growth conditions of the layer and upon the alloy composition of the layer. For example, the critical thickness of a layer of $Al_yGa_{1-y}N$ with y=0.2 is 700 Å to 900 Å, according to Shen et al. and Hiroki et al., reported in B. Shen, T. Someya, Y. Arakawa, "Dependence of strain relaxation of the $Al_xGa_{1-x}N$ barrier on transport properties of the two-dimensional electron gas in modulation-doped $Al_xGa_{1-x}N$/GaN heterostructure," Applied Physics Letters, vol. 76, pp. 2746–2748 (2000) and in M. Hiroki, N. Maeda, N. Kobayashi, "Metalorganic vapor phase epitaxy growth of AlGaN/GaN heterostructures on sapphire substrates," Journal of Crystal Growth, vol .237, pp. 956–960 (2002). The critical thickness of a layer of $Al_yGa_{1-y}N$ with y=0.4 is approximately 400 Å, according to Hiroki et al.

In some implementations, electron confinement layer 30 is grown to a thickness beyond its critical thickness and is consequently a relaxed layer. In such implementations, the magnitude of the sheet charges at either side of electron confinement layer 30 is reduced to that caused by the spontaneous polarization alone. The resulting magnitude is generally about half of the value that includes the effect of strain (i.e., includes the piezoelectric polarization).

In one implementation (FIG. 3A), for example, electron confinement layer 30 is formed from p-type $Al_yGa_{1-y}N$ (y=0.2) and has a thickness of 800 Å (which is greater than its critical thickness of about 700 Å), contact layer 32 is formed from p-type GaN, spacer layer 29 is formed from n-type GaN, and hole confinement layer 26 is formed from n-type GaN. In this implementation, active region 28 includes $In_xGa_{1-x}N$ (x=0.12) quantum well layers separated by GaN barrier layers. The detailed structure of active region 28 is not critical, however. For example, other implementations may include either more or fewer such quantum well and barrier layers. In the implementation shown in FIG. 3A, each layer other than electron confinement layer 30 is grown to a thickness less than its critical thickness.

Figure 3A:
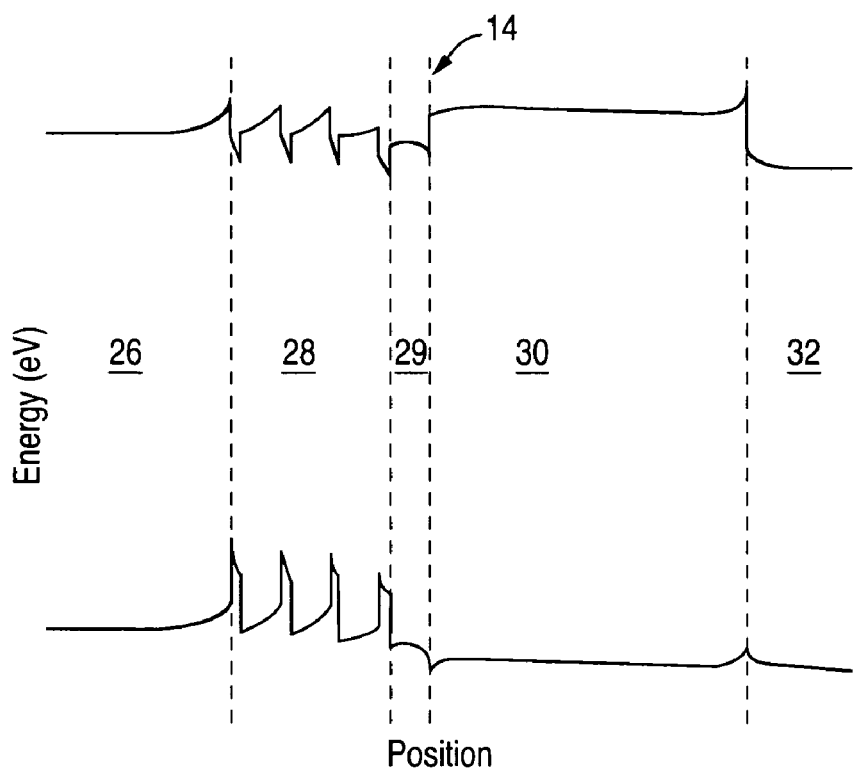
FIG. 3A shows a simulated band structure for a portion of a III-Nitride light-emitting device including a relaxed electron confinement layer according to one embodiment, FIG. 3B compares simulated quantum efficiencies for the prior art device of FIG. 1B and the device of FIG. 3A.

The simulated band structure shown in FIG. 3A accounts for the polarization fields in all of the layers shown and assumes that the light-emitting device is driven at a forward current density of about 200 A/cm². The magnitude of the sheet charge on either side of electron confinement layer 30 has been reduced to the value due to spontaneous polarization alone. Consequently, electron confinement layer 30 in this implementation provides a larger potential barrier 14 to diffusion of electrons out of the active region than is provided by the strained prior art electron confinement layer 10 shown in FIG. 1B.

Figure 1A:
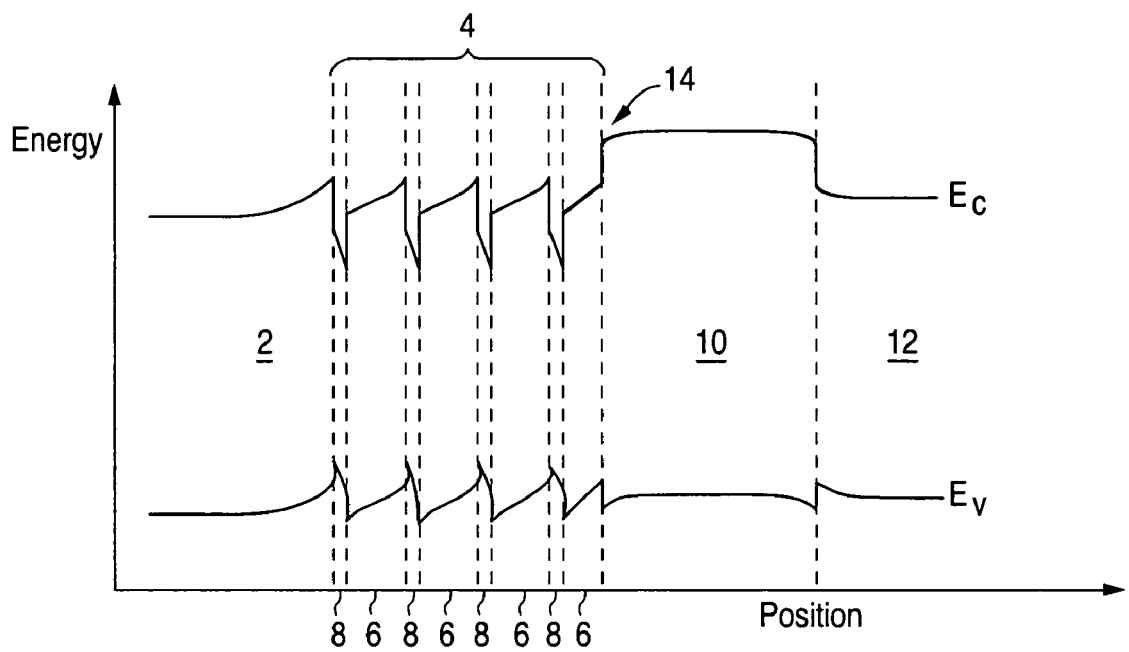
FIG. 1A shows a simulated band structure for a portion of a hypothetical III-Nitride light-emitting device including an electron confinement layer with no polarization field.
Figure 1B:
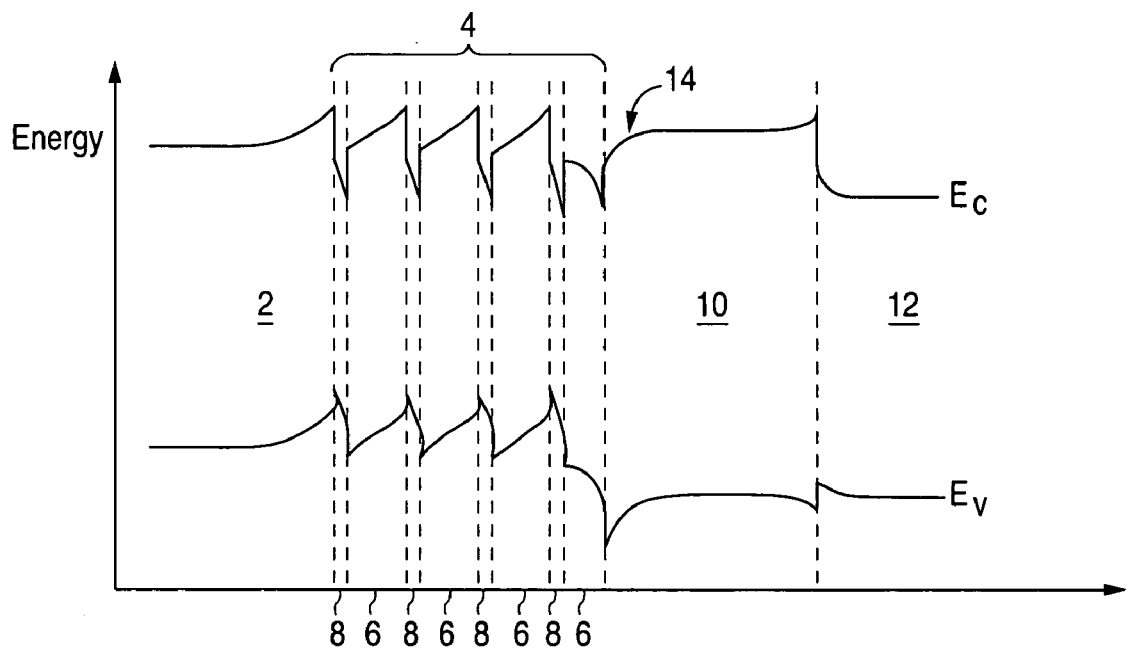
FIG. 1B shows a simulated band structure for a portion of a prior art III-Nitride light-emitting device including an electron confinement layer with a polarization field.
Figure 1C:
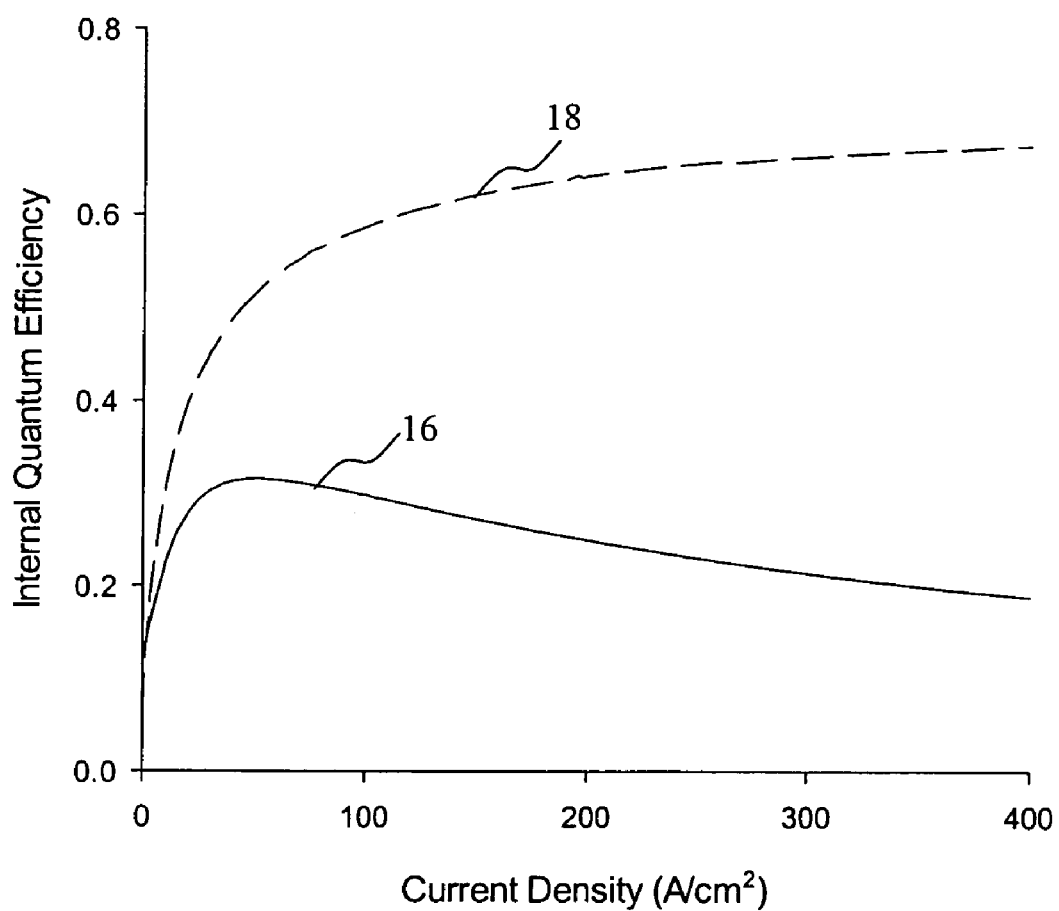
FIG. 1C compares simulated quantum efficiencies for the devices of FIGS. 1A and 1B as a function of drive current density.
Figure 3B:
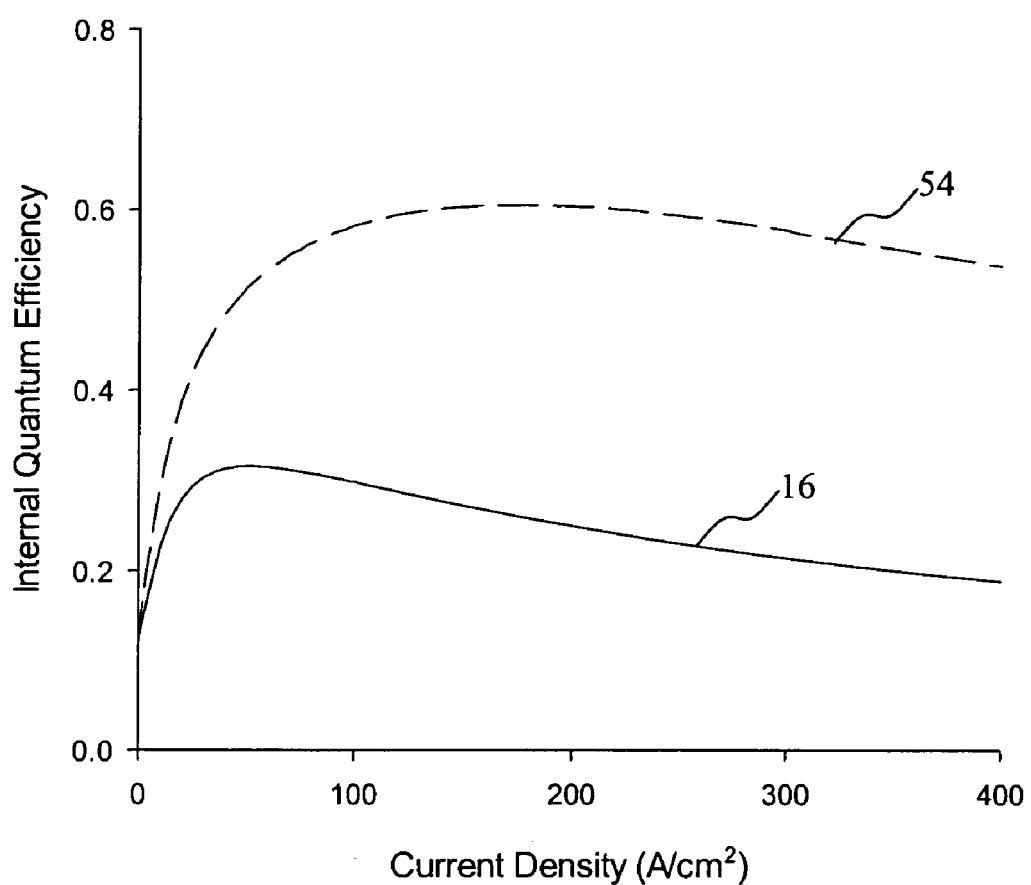

In FIG. 3B, the quantum efficiency 54 of the novel device illustrated in FIG. 3A and the quantum efficiency 16 of the prior art device illustrated in FIG. 1B are plotted as a function of forward drive current density. These quantum efficiencies were simulated by conventional techniques. Comparison of the two quantum efficiency curves demonstrates that even a partial reduction in the magnitude of the polarization field in the electron confinement layer (achieved, in the device of FIG. 3A, by allowing electron confinement layer 30 to relax) can result in substantial improvement in the high-current quantum efficiency.

In other implementations, hole confinement layer 26 is grown to a thickness beyond its critical thickness and is therefore a relaxed layer. In such implementations, the magnitude of the sheet charges at either side of hole confinement layer 26 is reduced to that caused by the spontaneous polarization alone. Consequently, the confinement of holes to the active region is advantageously improved compared to prior art devices not utilizing relaxed III-Nitride hole confinement layers.

Some implementations may include both a relaxed hole confinement layer 26 and a relaxed electron confinement layer 30.

In contrast to the present disclosure, one of ordinary skill in the art typically avoids growing any layer near the active region in a III-Nitride light-emitting device to a thickness beyond the layer's critical thickness, as the resulting dislocations are generally expected to reduce the quantum efficiency of the device by forming nonradiative recombination centers for electrons and holes injected into the device. Also, as reported by Hiroki et al. and Shen et al., the electron mobility in or near layers that are relaxed tends to be much lower. The inventors have recognized that despite the possibility of nonradiative recombination at dislocations, the use of a relaxed confinement layer in a III-Nitride light-emitting device may be advantageous.

The inventors have also recognized that the polarization fields in electron confinement layer 30 and/or in hole confinement layer 26 may be advantageously reduced, eliminated, or changed in sign by forming these layers from quaternary $In_xAl_yGa_{1-x-y}N$ alloys of particular compositions rather than from $Al_yGa_{1-y}N$ alloys as used in the prior art. (Quaternary $In_xAl_yGa_{1-x-y}N$ alloys include all three of In, Al, and Ga. That is, x>0, y>0, and x+y<1.) An additional advantage to the use of quaternary $In_xAl_yGa_{1-x-y}N$ confinement layers is that they may be lattice-matched to GaN layers such as, for example, GaN barrier layers in the active region. Such lattice matching facilitates the formation of nitride semiconductor layers of improved crystallinity.

Figure 4:
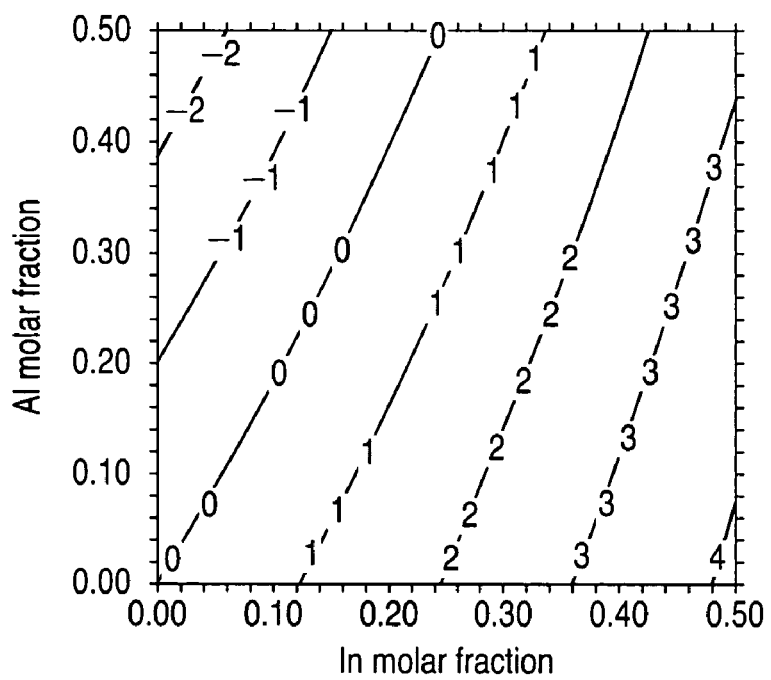
FIG. 4 shows the magnitude, in units of MV/cm, of the electric field across a layer of $In_xAl_yGa_{1-x-y}N$ grown on GaN as a function of composition.

FIG. 4 illustrates the magnitude, in units of megavolts/centimeter (MV/cm), of the total polarization field (including piezoelectric polarization and spontaneous polarization) across a layer of quaternary $In_xAl_yGa_{1-x-y}N$ grown on GaN. On the vertical axis is the mole fraction of aluminum in the layer, and on the horizontal axis is the mole fraction of indium in the layer. The lines with numbers in them are isometric lines of field magnitude. Along the vertical axis is represented the case of the zero indium mole fraction (i.e., the case of $Al_yGa_{1-y}N$). At any particular point on the vertical axis, as one moves horizontally to the right, the indium mole fraction increases, and the magnitude of the field decreases, eventually changing direction (switching sign) and then increasing again in magnitude. The sign change in the total polarization field occurs because the sign of the piezoelectric polarization changes as the strain in the $In_xAl_yGa_{1-x-y}N$ layer varies from compressive to tensile with increasing mole fraction of indium. The total polarization is zero for compositions in which the spontaneous and piezoelectric polarizations are equal in magnitude and opposite in direction. (FIG. 4 is taken from V. Fiorentini et al., Physical Review B, vol. 60, pp. 8849–8858, 1999, in which it is identified as FIG. 2.)

Figure 5:
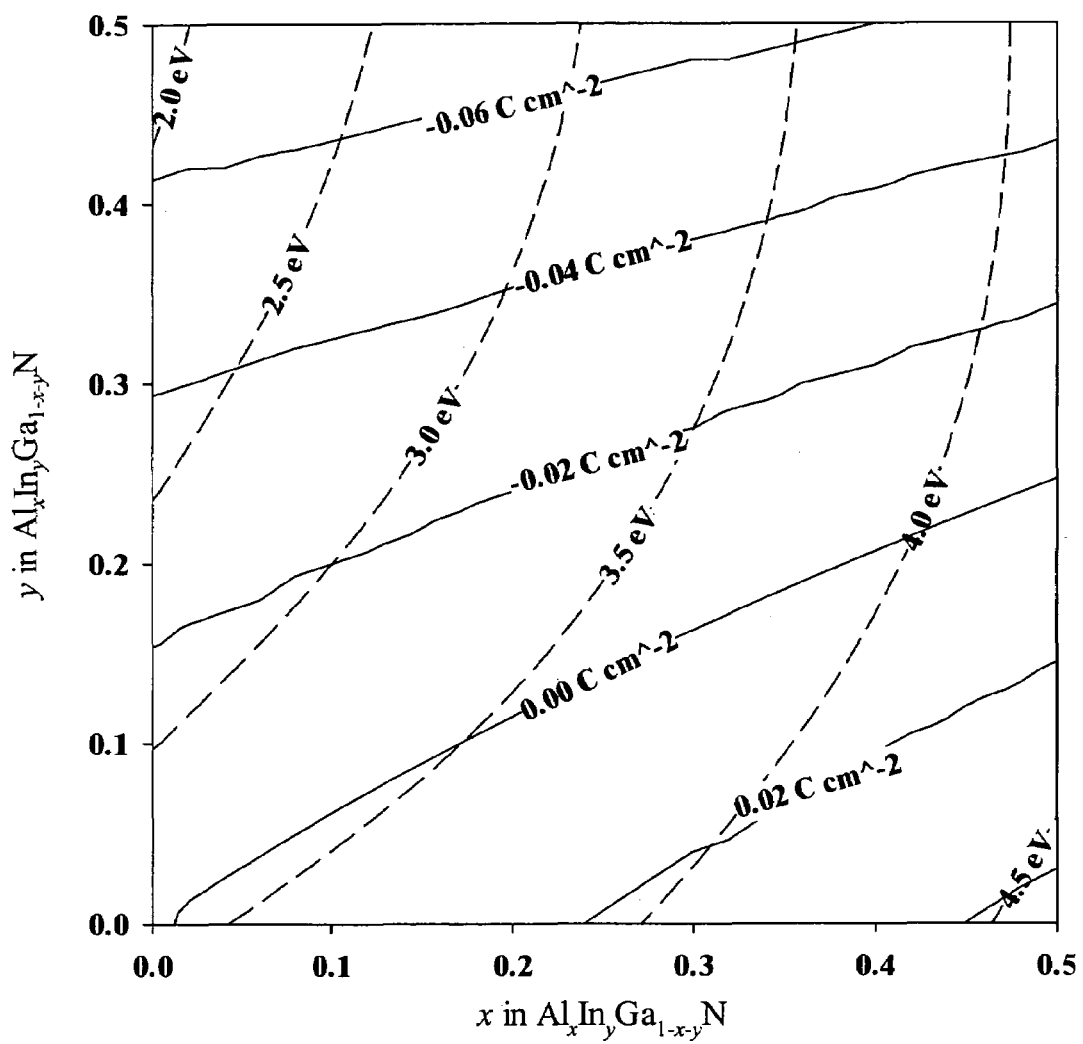
FIG. 5 shows the magnitude, in units of $C/cm^2$, of the net polarization at the interface of a layer of $In_xAl_yGa_{1-x-y}N$ grown on GaN as a function of composition, and the energy gap, in units of electron volts (eV), of the $In_xAl_yGa_{1-x-y}N$ layer.

The height of the potential barrier to carrier diffusion provided by an $In_xAl_yGa_{1-x-y}N$ confinement layer is affected by both the polarization field in the layer and the bandgap of the $In_xAl_yGa_{1-x-y}N$ material, which decreases with increasing indium mole fraction. FIG. 5 shows the variation with composition of the energy gap of an $In_xAl_yGa_{1-x-y}N$ confinement layer grown on a GaN layer, and the variation with composition of the net polarization at the interface of the $In_xAl_yGa_{1-x-y}N$ confinement layer and the GaN layer.

In some implementations electron confinement layer 30 (FIG. 2) is formed from a quaternary $In_xAl_yGa_{1-x-y}N$ alloy having a mole fraction of indium selected to determine the strength of the polarization field in the layer and thereby increase the potential barrier 14 to electron diffusion provided by the layer. In such implementations, the sheet charges at either side of electron confinement layer 30 may be eliminated, reduced in magnitude, or changed in sign. The confinement of electrons to active region 28 and the quantum efficiency of light-emitting device 20 may be thereby improved. Suitable indium and aluminum mole fractions include but are not limited to those in the range of 0.3 or less and 0.5 or less, respectively. Optimal compositions of the quaternary $In_xAl_yGa_{1-x-y}N$ confinement layer are determined by maximizing the confinement potential. The confinement potential is increased by a reduction in the sheet charge, and by an increase in the energy gap. Compositions of $In_xAl_yGa_{1-x-y}N$ which are advantageous for use as electron confinement layers are any of those compositions which have an energy gap greater than approximately 3.5 eV. In addition, the composition of the $In_xAl_yGa_{1-x-y}N$ electron confinement layer may be selected such that the difference between the total polarization in the electron confinement layer and the total polarization in an adjacent layer (a quantum well of the active region or spacer layer disposed between the electron confinement layer and the active region) is less than about 0.02 C/cm², more preferably less than about 0.01 C/cm². Compared to an AlGaN confinement layer with the same energy gap, a quaternary $In_xAl_yGa_{1-x-y}N$ confinement layer with any amount of indium will be advantageous.

Figure 6A:
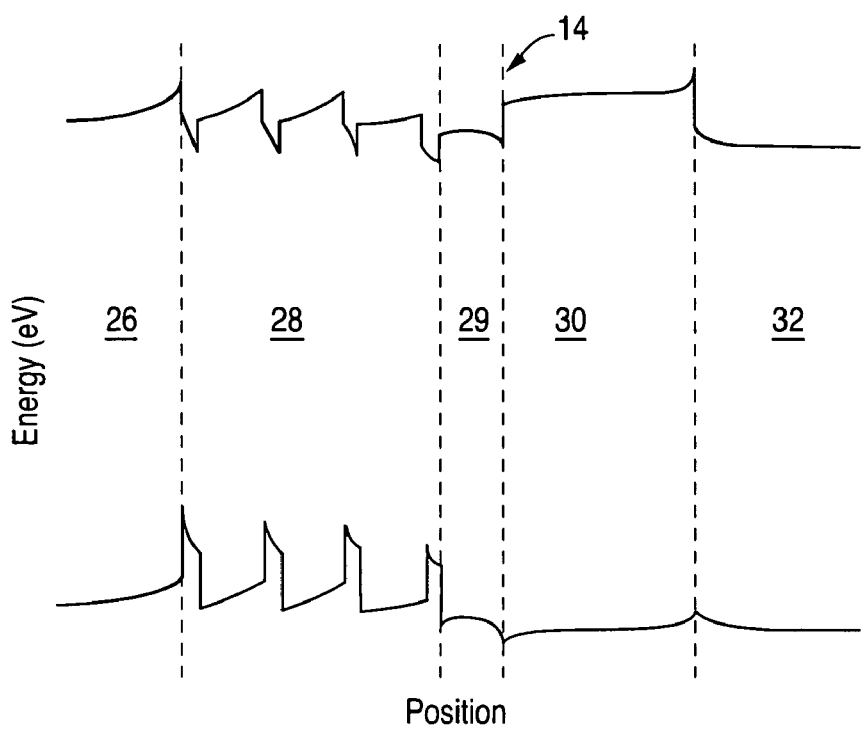
FIG. 6A shows a simulated band structure for a portion of a III-Nitride light-emitting device including a quaternary $In_xAl_yGa_{1-x-y}N$ electron confinement layer according to one embodiment.
Figure 6B:
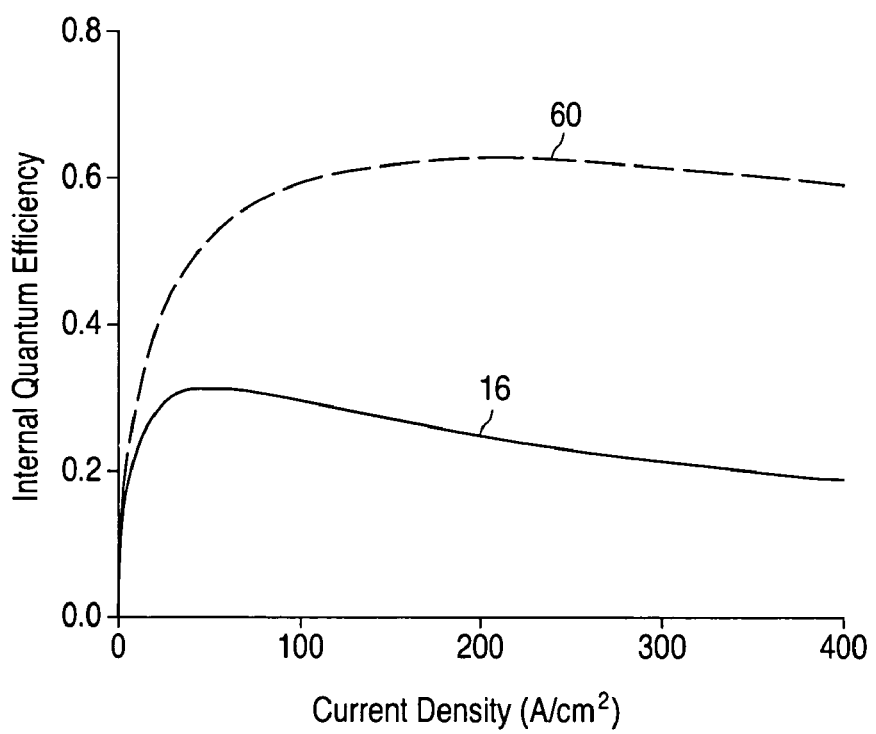
FIG. 6B compares simulated quantum efficiencies for the prior art device of FIG. 1B and the device of FIG. 6A.

In one implementation, for example, the confinement layer 30 is formed of $In_xAl_yGa_{1-x-y}N$ where x=0.106 and y=0.3. In this case, the energy gap of the $In_xAl_yGa_{1-x-y}N$ layer is the same as the energy gap of an $Al_yGa_{1-y}N$ layer where y=0.2, but the polarization-induced sheet charge is smaller. The band structure of this implementation is illustrated in FIG. 6A. In FIG. 6B, the quantum efficiency of the novel device 60 illustrated in FIG. 6A and the quantum efficiency 16 of the prior art device illustrated in FIG. 1B are plotted as a function of forward drive current density. These quantum efficiencies were simulated by conventional techniques. Comparison of the two quantum efficiency curves demonstrates that even a partial reduction in the difference between the total polarization in the electron confinement layer and the total polarization in an adjacent layer (achieved, in the device of FIG. 6A, by selecting an optimal composition of $In_xAl_yGa_{1-x-y}N$ which has the same energy gap as the $Al_yGa_{1-y}N$ confinement layer illustrated in the prior art device of FIG. 1B) can result in substantial improvement in the high-current quantum efficiency.

Figure 7A:
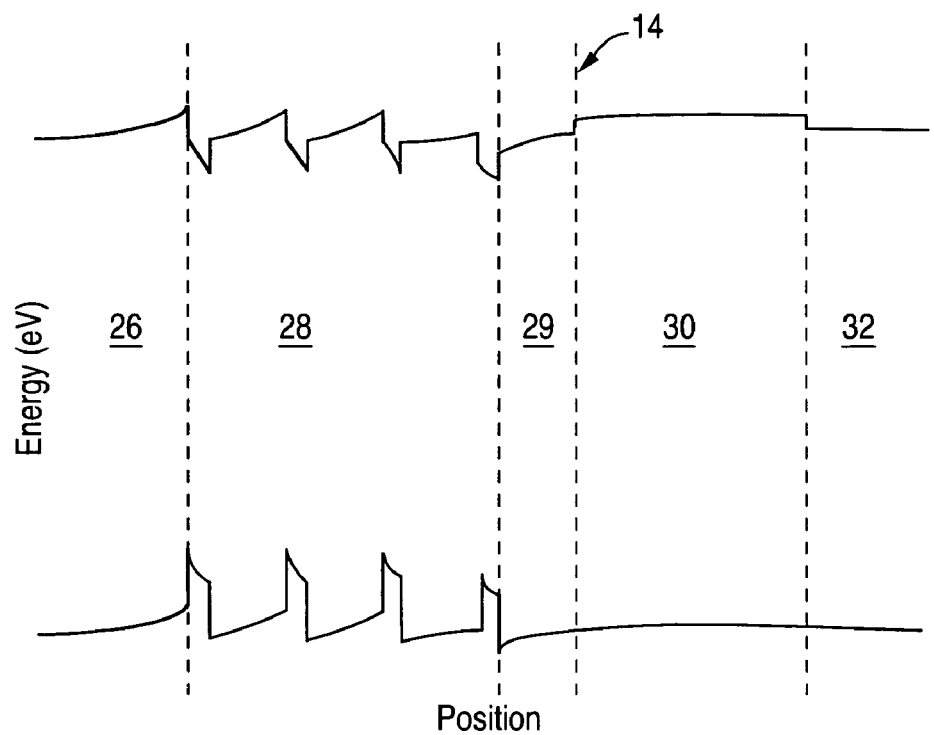
FIG. 7A shows a simulated band structure for a portion of a III-Nitride light-emitting device including a quaternary $In_xAl_yGa_{1-x-y}N$ hole confinement layer according to one embodiment.
Figure 7B:
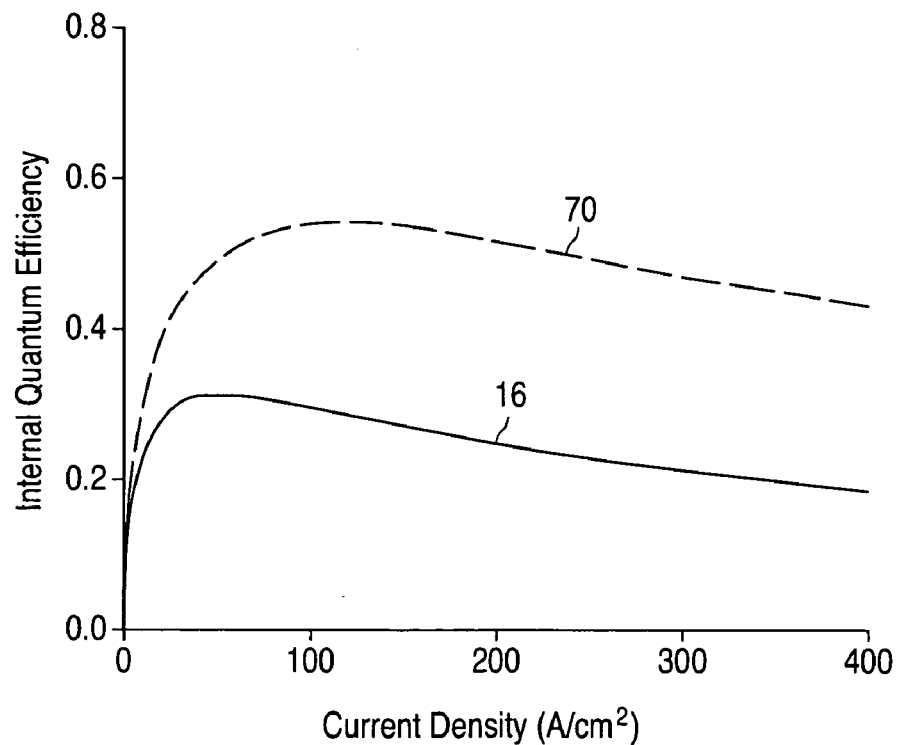
FIG. 7B compares simulated quantum efficiencies for the prior art device of FIGS. 1B and the device of FIG. 7A.

In another implementation, the confinement layer 30 is formed of $In_xAl_yGa_{1-x-y}N$ where x=0.115 and y=0.2. In this case, the energy gap of the $In_xAl_yGa_{1-x-y}N$ layer is the same as the energy gap of an $Al_yGa_{1-y}N$ layer where y=0.06, but the difference in net polarization between the $In_xAl_yGa_{1-x-y}N$ layer and an adjacent layer is nearly zero. The effect of the small energy gap of this layer on the confinement potential is offset by the effect of the small polarization sheet charge. The band structure of this implementation is illustrated in FIG. 7A. In FIG. 7B, the quantum efficiency of the novel device 70 illustrated in FIG. 7A and the quantum efficiency 16 of the prior art device illustrated in FIG. 1B are plotted as a function of forward drive current density. These quantum efficiencies were simulated by conventional techniques. Comparison of the two quantum efficiency curves demonstrates that a partial reduction in the magnitude of the polarization sheet charge at the edges of the electron confinement layer can result in substantial improvement in the high-current quantum efficiency even in cases where the energy gap of the confinement layer is smaller than that typically used for prior art devices.

Similarly, in some implementations hole confinement layer 26 (FIG. 2) is formed from a quaternary $In_xAl_yGa_{1-x-y}N$ alloy having a mole fraction of indium selected to determine the strength of the polarization field in the layer and thereby increase the potential barrier to hole diffusion provided by the layer. In such implementations, the sheet charges at either side of electron confinement layer 26 may be eliminated, reduced in magnitude, or changed in sign. The confinement of holes to active region 28 and the quantum efficiency of light-emitting device 20 may be thereby improved. It is particularly important for a hole confinement layer that the polarization sheet charge be small. Consequently, the optimal composition of a quaternary $In_xAl_yGa_{1-x-y}N$ hole confinement layer is one with an energy gap greater than 3.5 eV, and one where the difference between the total polarization in the hole confinement layer and the total polarization in an adjacent layer is less than 0.02 $C/cm^2$, more preferably less than about 0.01 $C/cm^2$.

The aluminum in quaternary III-Nitride confinement layers may promote contamination of these layers with oxygen. Such oxygen contaminants may enhance non-radiative recombination of electrons and holes in the quaternary III-Nitride layers and thereby reduce the quantum efficiency of a light-emitting device in which they are included. Hence, it may be advantageous to space quaternary III-Nitride confinement layers apart from light-emitting layers (e.g., quantum wells) in the active region of the device. Such spacing apart may be accomplished, for example, with spacer layers 27, 29 included in the active region. Spacer layers 27 and 29 may have a thickness between about 50 angstroms and about 200 angstroms. A common thickness is about 100 angstroms. Spacer layers 27 and 29 are usually n-type layers, though in some embodiments spacer layer 29 may be p-type. The spacer layers may be GaN or ternary nitride alloys of aluminum, indium, and gallium. For example, in the implementation illustrated in FIG. 6A, a GaN spacer layer 29 is disposed between electron confinement layer 30 and the quantum well layers 28. Similarly, in the implementation illustrated in FIG. 7A, a GaN spacer layer 29 is disposed between electron confinement layer 30 and the quantum well layers 28. In other implementations, though, quaternary III-Nitride confinement layers may be in contact with light-emitting layers.

Figure 8:
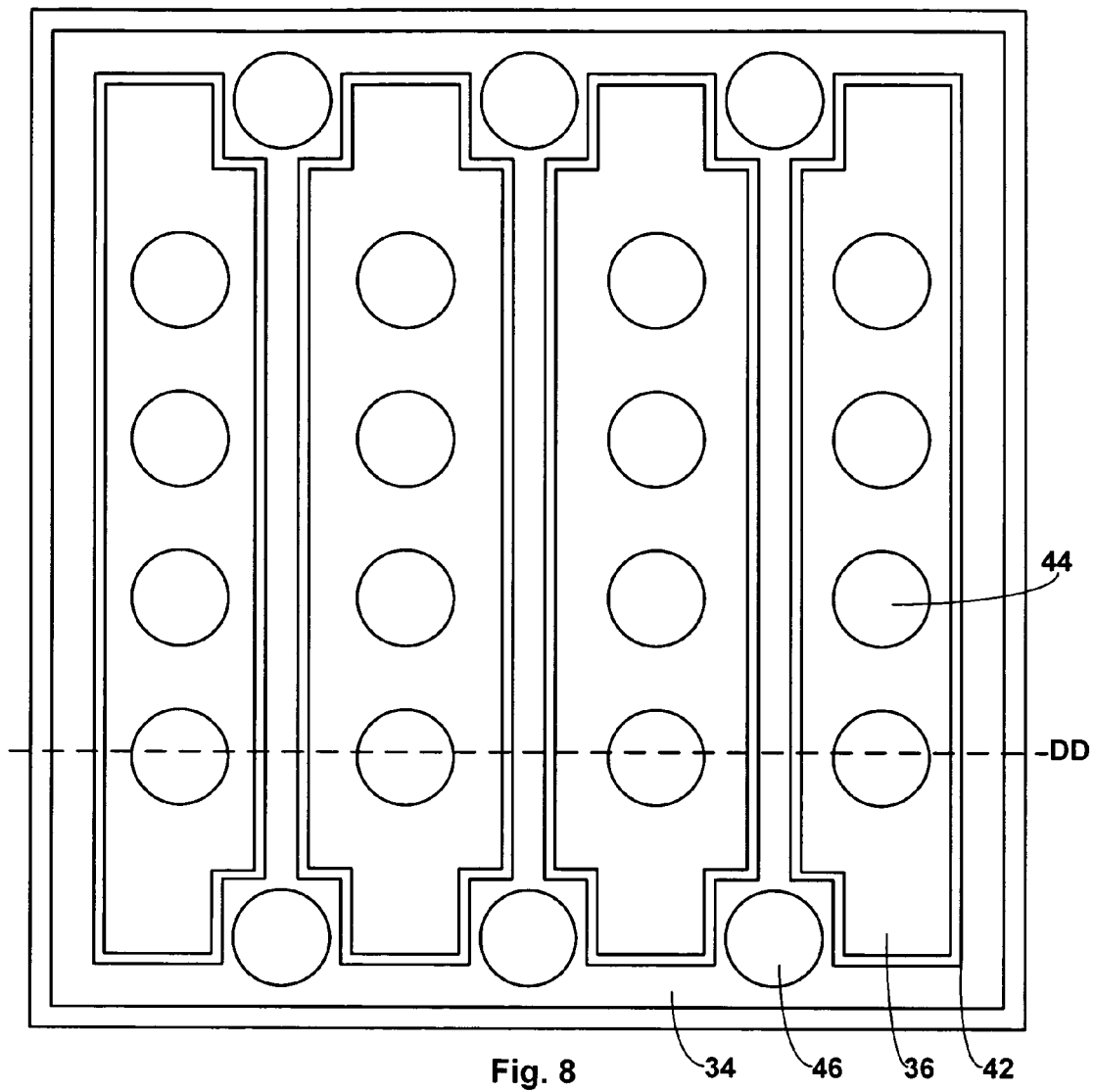
FIGS. 8 and 9 are a plan view and a cross sectional view of a large junction light emitting device according to embodiments of the invention.
Figure 9:
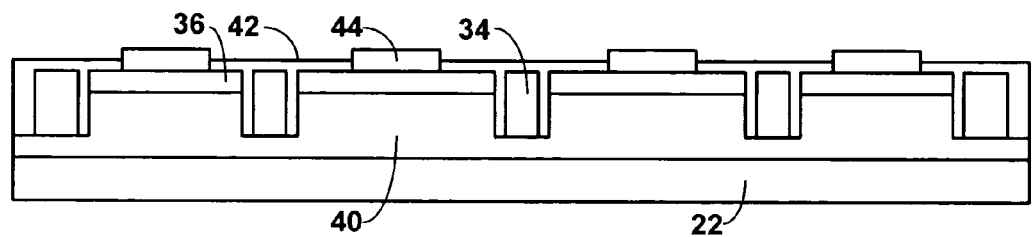

FIG. 8 is a plan view of a large junction device (i.e. an area greater than or equal to 0.2 square millimeters). FIG. 9 is a cross section of the device shown in FIG. 8, taken along axis DD. FIGS. 8 and 9 illustrate an arrangement of contacts that may be used with any of the epitaxial structures 40 illustrated in FIGS. 2, 3A, 6A, 7A, and described above. The active region of epitaxial structure 40 is separated into four regions separated by three trenches in which n-contacts 34 are formed. Each region is connected to a submount by four p-submount connections 44 formed on p-contact 36. N-contact 34 surrounds the four active regions. N-contact 34 is connected to a submount by six n-submount connections 46. The n- and p-contacts may be electrically isolated by an insulating layer 42.

Figure 10:
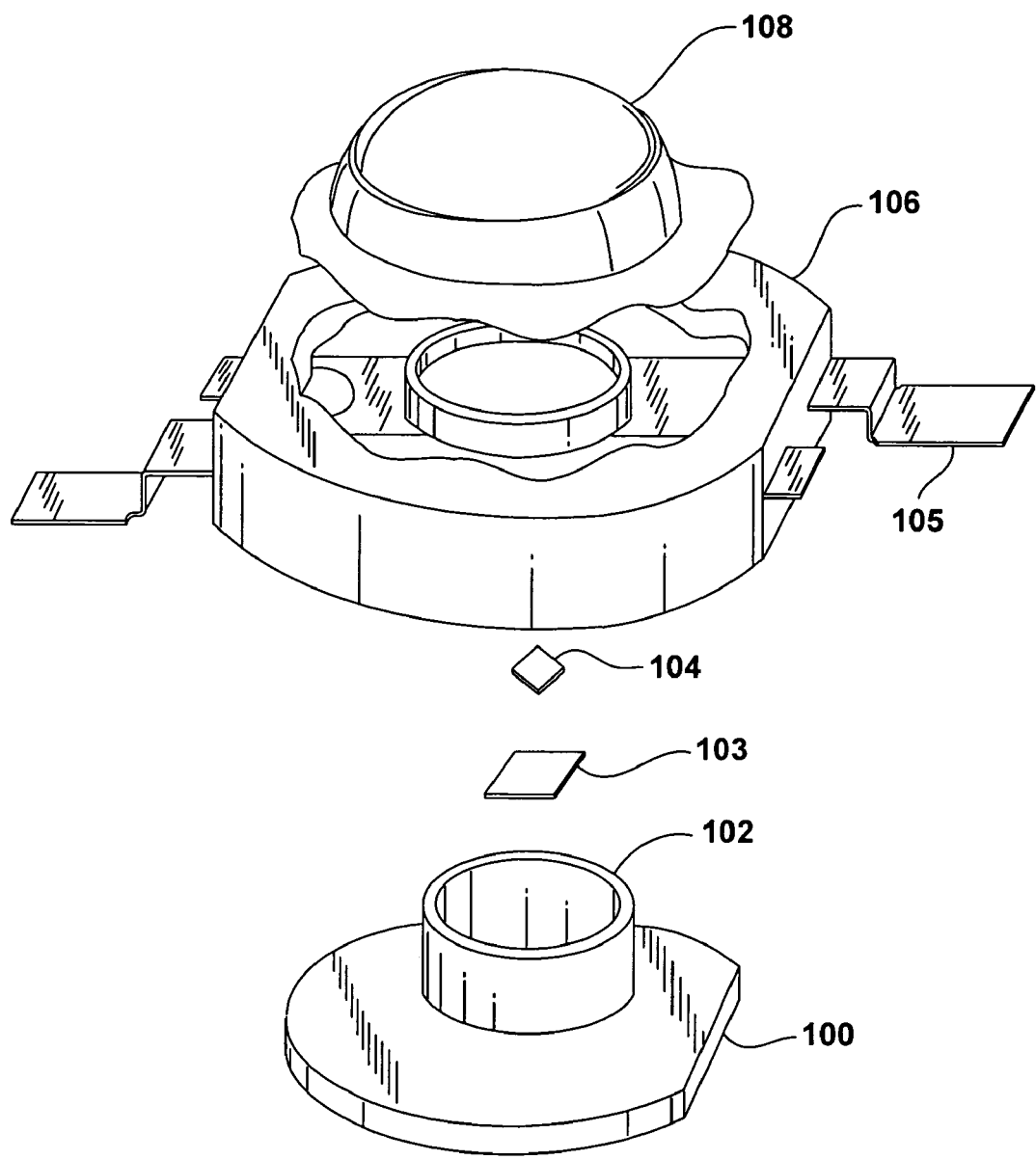
FIG. 10 is an exploded view of a packaged light emitting device.

FIG. 10 is an exploded view of a packaged light emitting device. A heat-sinking slug 100 is placed into an insert-molded leadframe. The insert-molded leadframe is, for example, a filled plastic material 105 molded around a metal frame 106 that provides an electrical path. Slug 100 may include an optional reflector cup 102. The light emitting device die 104, which may be any of the devices described above, is mounted directly or indirectly via a thermally conducting submount 103 to slug 100. A cover 108, which may be an optical lens, may be added.

While the present invention is illustrated with particular embodiments, the invention is intended to include all variations and modifications falling within the scope of the appended claims. Referring again to FIG. 2, for example, substrate 22 may be formed from materials other than sapphire, such as SiC. Electrode 36 may be transparent or semitransparent to light emitted by active region 28. Alternatively, electrode 36 may be highly reflective to light emitted by active region 28, and light-emitting device 20 may be mounted as a flip-chip with contacts 34 and 36 facing a submount.

Moreover, III-Nitride electron and hole confinement layers having reduced polarization fields as disclosed herein may be formed in other III-Nitride light-emitting devices such as, for example, those described in U.S. Pat. No. 6,133,589 and in U.S. Pat. No. 6,486,499, both of which are assigned to the assignee of the present invention and incorporated herein by reference. In addition, light-emitting devices in accordance with the present invention may include layers not shown in the illustrated embodiments and may omit illustrated layers such as contact layer 32 (FIG. 2), for example. The composition of the various III-Nitride layers in the inventive light-emitting devices (such as the contact, quantum well, and barrier layers, for example) may vary from the example compositions disclosed.

What is being claimed is:

1. A light-emitting semiconductor device comprising:
a III-Nitride active region; and
a III-Nitride layer formed proximate to said active region; wherein a thickness of said III-Nitride layer exceeds a critical thickness for relaxation of strain in said layer, said III-Nitride layer comprises $Al_xGa_{1-x}N$ where $0.35<x<0.45$, and said thickness of said III-Nitride layer exceeds about 400-Angstroms.

2. The light-emitting semiconductor device of claim 1, wherein said III-Nitride layer is in direct contact with said III-Nitride active region.

3. The light-emitting semiconductor device of claim 1, wherein said III-Nitride layer is of p-type conductivity.

4. The light-emitting semiconductor device of claim 1, wherein said III-Nitride layer is a first III-Nitride layer, the device further comprising a second III-Nitride layer having a thickness that exceeds a critical thickness for relaxation of strain in said layer, wherein said second III-Nitride layer is of n-type conductivity.

5. The light emitting semiconductor device of claim 1, wherein said thickness of said III-Nitride layer exceeds about 700 Angstroms.

6. The light emitting semiconductor device of claim 1, wherein said thickness of said III-Nitride layer exceeds about 900 Angstroms.

7. The light emitting semiconductor device of claim 1, wherein the active region is disposed between an n-type region and a p-type region, the device further comprising:
first and second contacts disposed on the p- and n-type regions;
first and second leads electrically coupled to the first and second contacts; and
a cover disposed over the active region.

8. A light-emitting semiconductor device comprising:
a III-Nitride light emitting layer;
an $In_xAl_yGa_{1-x-y}N$ layer, wherein $0<x\leq1$, $0<y\leq1$, and $x+y\leq1$; and
a spacer layer interposing the light emitting layer and the $In_xAl_yGa_{1-x-y}N$ layer.

9. The light-emitting semiconductor device of claim 8, wherein said $In_xAl_yGa_{1-x-y}N$ layer is in direct contact with said spacer layer.

10. The light-emitting semiconductor device of claim 8, wherein said spacer layer is GaN.

11. The light-emitting semiconductor device of claim 8, wherein said spacer layer is GaN.

12. The light-emitting semiconductor device of claim 8, wherein said spacer layer is AlGaN.

13. The light-emitting semiconductor device of claim 8, wherein said $In_xAl_yGa_{1-x-y}N$ layer is of p-type conductivity.

14. The light-emitting semiconductor device of claim 8, wherein said $In_xAl_yGa_{1-x-y}N$ layer is of n-type conductivity.

15. The light-emitting semiconductor device of claim 8, wherein said $In_xAl_yGa_{1-x-y}N$ layer has a hand gap greater than about 3.5 eV.

16. The light-emitting semiconductor device of claim 8, wherein said $In_xAl_yGa_{1-x-y}N$ layer has an indium composition x greater than about 0.05.

17. The light-emitting semiconductor device of claim 8, wherein said $In_xAl_yGa_{1-x-y}N$ layer has an indium composition x between about 0.05 and about 0.15.

18. The light-emitting semiconductor device of claim 8, wherein said $In_xAl_yGa_{1-x-y}N$ layer has an aluminum composition y greater than about 0.15.

19. The light-emitting semiconductor device of claim 8, wherein said $In_xAl_yGa_{1-x-y}N$ layer has an aluminum composition y between about 0.15 and about 0.35.

20. The light-emitting semiconductor device of claim 8, wherein a difference between a total polarization in the $In_xAl_yGa_{1-x-y}N$ layer and a total polarization in the spacer layer has a magnitude less than about 0.02 C/cm².

21. The light-emitting semiconductor device of claim 8 wherein a difference between a total polarization in the $In_xAl_yGa_{1-x-y}N$ layer and a total polarization in the spacer layer has a magnitude less than about 0.01 C/cm².

22. The light emitting semiconductor device of claim 8, wherein the light emitting layer is disposed between an n-type region and a p-type region, the device further comprising:
first and second contacts disposed on the p- and n-type regions;
first and second leads electrically coupled to the first and second contacts; and
a cover disposed over the light emitting layer.

* * * * *

UNITED STATES PATENT AND TRADEMARK OFFICE
CERTIFICATE OF CORRECTION

PATENT NO. : 6,943,381 B2
DATED : September 13, 2005
INVENTOR(S) : Nathan F. Gardner, Christopher P. Kocot and Stephen A. Stockman Page 1 of 1

It is certified that error appears in the above-identified patent and that said Letters Patent is hereby corrected as shown below:

<u>Column 9,</u>
Line 8, delete "$0.35<x<0.45$," and substitute -- $0.35 \leq x \leq 0.45$, --.

Signed and Sealed this

Twenty-seventh Day of December, 2005

JON W. DUDAS
*Director of the United States Patent and Trademark Office*